(12) United States Patent
    Kinoshita

(10) Patent No.: US 7,968,801 B2
(45) Date of Patent: Jun. 28, 2011

(54) SOLDER MOUNTING STRUCTURE, METHOD FOR MANUFACTURING SUCH SOLDER MOUNTING STRUCTURE AND USE OF SUCH SOLDER MOUNTING STRUCTURE

(75) Inventor: Kazuo Kinoshita, Hiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 676 days.

(21) Appl. No.: 12/011,565

(22) Filed: Jan. 25, 2008

(65) Prior Publication Data
    US 2008/0237302 A1    Oct. 2, 2008

Related U.S. Application Data

(63) Continuation of application No. PCT/JP2006/314379, filed on Jul. 20, 2006.

(30) Foreign Application Priority Data

Jul. 28, 2005 (JP) ................................. 2005-219547

(51) Int. Cl.
    *H05K 1/11* (2006.01)
(52) U.S. Cl. ........................................ 174/261; 361/743
(58) Field of Classification Search .................. 174/255, 174/260, 267, 261; 361/743, 775–795; 257/202–209
    See application file for complete search history.

(56) References Cited

U.S. PATENT DOCUMENTS

| 6,005,198 | A * | 12/1999 | Gregoire .................. 174/262 |
| 7,038,917 | B2 * | 5/2006 | Vinciarelli et al. .......... 361/778 |
| 2002/0100610 | A1 | 8/2002 | Yasuda et al. |
| 2003/0218873 | A1 * | 11/2003 | Eromaki et al. ............. 361/816 |
| 2004/0007384 | A1 | 1/2004 | Soga et al. |
| 2006/0145352 | A1 | 7/2006 | Soga et al. |
| 2007/0084904 | A1 * | 4/2007 | Sumikawa et al. .......... 228/101 |
| 2008/0135283 | A1 * | 6/2008 | Hibino et al. ............... 174/260 |

FOREIGN PATENT DOCUMENTS

| JP | 04-037147 | 2/1992 |
| JP | 11-017065 | 1/1999 |
| JP | 2001-060759 | 3/2001 |
| JP | 2002-151532 A | 5/2002 |

(Continued)

OTHER PUBLICATIONS

S. K. Patra et al., "Quantitative Characterization of a Flip-Chip Solder Joint", Journal of Applied Mechanics, vol. 62, Jun. 1995, pp. 390-397. International Search Report, Oct. 3, 2006.

*Primary Examiner* — Yuriy Semenenko
(74) *Attorney, Agent, or Firm* — Edwards Angell Palmer & Dodge LLP; David G. Conlin

(57) ABSTRACT

The camera module structure (10) of the present invention is arranged such that a board electrode (2) of a printed board (1) and a mounting electrode (4) of a camera module (3) mounted on the printed board (1) are joined with each other through a solder joint section (5), and the board electrode (2) and the mounting electrode (4) are aligned by self-alignment. The solder joint section (5) includes a solder section (16) for solder-joining, and a supporting section (17) for supporting the camera module (3). The present invention realizes a solder mounting structure wherein a heavy-weight component is joined on the board with solder by self-alignment.

13 Claims, 6 Drawing Sheets

FOREIGN PATENT DOCUMENTS

| | | |
|---|---|---|
| JP | 2002-368373 | 12/2002 |
| JP | 2003-188515 | 7/2003 |
| JP | 2003-243757 | 8/2003 |
| JP | 2003-298167 | 10/2003 |
| JP | 2004-342959 | 12/2004 |
| WO | WO2004105053 | * 12/2004 |

* cited by examiner

SOLDER MOUNTING STRUCTURE, METHOD FOR MANUFACTURING SUCH SOLDER MOUNTING STRUCTURE AND USE OF SUCH SOLDER MOUNTING STRUCTURE

CROSS-REFERENCE TO RELATED APPLICATIONS

This application is a continuation of PCT International Application No. PCT/JP2006/314379, filed Jul. 20, 2006, which claims priority to Japanese patent application no. 2005-219547, filed Jul. 28, 2005. The contents of these applications are incorporated herein by reference in their entirety.

TECHNICAL FIELD

The present invention relates to a solder mounting structure, a method for manufacturing such a solder mounting structure and use of such a solder mounting structure, each of which allows comparatively heavy-weight components to be mounted on the structure.

BACKGROUND ART

As one method of mounting an integrated circuit (IC) package or a chip-shaped electronic component (mounting component) on a board by solder, there has been known of a method in which solder is melted by applying heat from a backside of the board (the surface opposite to the surface on which the electronic components are mounted). In this method, in order to melt the solder, it is required to heat the backside of the board to a much higher temperature than a melting temperature of the solder. As a result, bubbles are generated on the backside of the board of the solder joint section due to thermal stress. Furthermore, with this method, the electronic components are pressed by a machine when soldering. This would cause such a problem as short-circuit or misalignment in the soldered section.

In order to solve these problems, there is a method to mount electronic components on the board by self-alignment. Self-alignment is such an effect that the electronic component is lifted by surface tension and stress of the molten solder, and then self-aligns itself on the mounting position on the board by restitution from the stress. In other words, the self-alignment is such an effect of the surface tension of the molten solder that transfers an electrode of the electronic component toward an electrode of the board when the solder is melted by the application of heat and spread out on the electrode of the board.

Thus, the self-alignment can align the board and the electronic component being mounted on the board with high precision without forcibly causing the alignment. Therefore, self-alignment is drawing attention among mounting methods for mounting electronic components wherein alignment of high precision is required.

For example, in Non-Patent Document 1, it is disclosed that the alignment of the core of a fiber-optic cable and the center of a light-receiving element is performed by self-alignment. In Non-Patent Document 1, an optical member with the requirement of aligning in comparatively high precision is aligned by the self-alignment.

In addition, for example, in Patent Documents 1 and 2, it is disclosed that mounting of IC packages (Chip Scale Packages (CSP)) and chip-shaped electronic components is performed by self-alignment.

Specifically, in Patent Document 1, when mounting an electronic component such as so-called chip component (resistor, capacitor, or the like), or an IC component, on the printed board (surface mounting), positioning of the electronic component is performed by the self-alignment. In Patent Document 1, in order to smoothly perform the self-alignment, the printed board is ultrasonically oscillated at the time of mounting the electronic component.

On the other hand, in Patent Document 2, the effect of self-alignment is increased by appropriately arranging a shape (area) and position of a solder joint section (terminal land) of an IC package component (CSP).

Because the self-alignment utilizes the surface tension of molten solder as described above, the self-alignment has been applied in mounting comparatively light-weight components. For example, alignment such as IC packages (mounting of independent IC bare chips, QFP etc.) and chip-shaped electronic components has been performed by the self-alignment.

Patent Document 1
  Japanese Unexamined Patent Publication, Tokukai, No. 2003-188515 (published on Jul. 4, 2003)
Patent Document 2
  Japanese Unexamined Patent Publication, Tokukai, No. 2003-243757 (published on Aug. 29, 2003)
Non-Patent Document 1
  Journal of Applied Mechanics, Vol. 62, JUNE 1995, 390-397.

DISCLOSURE OF INVENTION

Technical Problem

However, conventionally, the self-alignment has not been applied with mounting heavy-weight electronic components, because the self-alignment uses the surface tension of molten solder, which if an electronic component being mounted on the board is too heavy will not function and unable to withstand the heaviness. If the surface tension does not function, obviously alignment with high precision may not be performed by the self-alignment.

It is common with camera modules mounted in recent digital still cameras and mobile phones to have multiple functions such as automatic focus function and automatic zooming function. These multifunctional camera modules especially require alignment with high precision.

However, such multifunctional camera modules inevitably have heavy weights, so alignment with high precision by self-alignment has not been performed.

Accordingly, a technology is yearned for, which makes it possible to apply the self-alignment to mounting of heavy-weight electronic components that require especially high precision alignment such as multifunctional camera modules.

In Non-Patent Document 1, it is said that in order for self-alignment to occur, the prerequisite condition is that the surface tension functioning between the electronic component and the molten solder matches the weight of the mounting component thereby attaining an elastic balance therebetween. From this description also, it is the current situation that the self-alignment can only be applicable for comparatively light-weight components.

In addition, if the printed board being soldered is ultrasonically oscillated as in Patent Document 1, there is a fear of damaging the electronic component being joined to the printed board.

In addition, even if the shape and the allocation of the solder joint section are appropriately arranged as in Patent Document 2, the self-alignment utilizing the surface tension of the solder will be performed. Consequently, if the electronic component joined to the board is heavy, there is the problem that the surface tension will not function and the self-alignment effect will not be obtained.

The present invention is made in view of the aforementioned problems, and an object of the present invention is to provide a solder mounting structure with heavy-weighted components soldered to the board by self-alignment, a method for manufacturing such a solder mounting structure, and a solder mounting structure and electronic device using the solder mounting structure and method.

Technical Solution

Specifically, in order to achieve the object, the solder mounting structure of the present invention is arranged such that a board electrode of a board and a mounting electrode of a mounting component mounted on the board are joined with each other by a solder joint section, and said solder joint section comprises a solder section for solder-joining and a supporting section for supporting the mounting component.

According to the structure, the solder joint section joining the board electrode and the mounting electrode comprises the solder section for solder-joining and the supporting section for supporting the mounting component. Therefore, by using the supporting section to support the mounting component and using the solder section for self-alignment, it is possible to perform alignment by self-alignment effected by the solder section while supporting the mounting component with the supporting section. That is, it is possible to manufacture the solder mounting structure with the board electrode and the mounting electrode being aligned by self-alignment. Consequently, even if the mounting component is heavy, it is possible to perform alignment by self-alignment. Therefore, it is possible to provide a solder mounting structure with a board electrode and a mounting electrode being aligned with high precision.

Conventionally, in order to align a board electrode and a mounting electrode by self-alignment, the mounting component should be light-weight and compact. This is because the mounting component is supported by only surface tension of a molten solder, and cannot withstand the load of the mounting component.

The solder mounting structure of the present invention is preferably arranged such that said supporting section is made of a material with a higher melting temperature than solder composing the solder section.

According to the structure, the material composing the supporting section is made of a material with a higher melting temperature than solder composing the solder section. Thus, even if the solder is melted in order to form the solder section, the supporting section will not melt and stay solid. Therefore, even if the mounting component is heavy, it will be possible to securely support the mounting component with the solid supporting section. Thus, it is possible to perform the alignment by self-alignment effected by a molten solder while supporting the mounting component with the solid supporting section.

In the solder mounting structure of the present invention, said supporting section is preferably made of an electrically conductive material.

According to the structure, not just the solder section but also the supporting section has electrical conductivity, thereby the board and the mounting component are joined securely.

In the solder mounting structure of the present invention, said supporting section is preferably spherical, and is sandwiched between a recess section of said board electrode and a recess section of said mounting electrode.

According to the structure, the spherical supporting section is sandwiched between a recess section of the board electrode and a recess section of the mounting electrode. Therefore, the self-alignment position will be where the recess sections on each of the board electrode and mounting electrode face each other. Thus, at the time of self-alignment, the supporting section is securely fixed at the recess sections of each electrode. Therefore, it is possible to align the board electrode and the mounting electrode with a higher precision.

In the solder mounting structure of the present invention, said board electrode and mounting electrode are preferably covered with said solder joint section.

According to the structure, since the solder joint section is formed covering the board electrode and the mounting electrode, the board and the mounting component are securely joined. Therefore, it is possible to provide a solder mounting structure with a high joint reliability.

In the solder mounting structure of the present invention, said supporting section is preferably provided in a central part of said solder joint section.

With said structure, in which the supporting section supporting the mounting component is provided in the central part of the solder joint section, the supporting section can stably support the mounting component.

In the solder mounting structure of the present invention, said solder section is preferably made of a Pb-free solder. Thus, it is possible to provide a solder mounting structure using an environmentally-friendly solder.

In the solder mounting structure of the present invention, said mounting component may be an optical element. For example, said optical element is preferably a camera module.

Optical elements such as camera modules mounted on digital still cameras and mobile phones are especially required to mount on the board with highly precise alignment.

According to the structure, it is possible to align these optical elements by self-alignment with high precision.

In the solder mounting structure of the present invention, said solder joint section may have a broader area of the solder section than the area of the supporting section. Thus, surface tension will function more easily, and self-alignment is smoothly performed.

With the solder mounting structure of the present invention, said solder joint section may have a broader area of the supporting section than the area of the solder section. Thus, even in the case the mounting component is heavy, it is possible to securely support the mounting component.

In the solder mounting structure of the present invention, said supporting section, or at least a surface thereof, may be made of a material selected from the group consisting of Au, Ag, Cu, Sn, and alloys thereof. These materials have a good affinity with solder and a good electrical conductivity, therefore soldering of high quality is possible.

The method of the present invention for manufacturing solder mounting structure, in order to achieve the above object, is a method for manufacturing a solder mounting structure in which a board electrode of a board and a mounting electrode of a mounting component mounted on the board are joined with each other by a solder joint section, the method including forming the solder joint section comprising a solder section for solder-joining and a supporting section for supporting the mounting component, and aligning the board electrode and the mounting electrode by self-alignment effected by solder composing the solder section while supporting the mounting component with the supporting section.

According to the method, in order to form a solder joint section comprising a solder section and a supporting section, by using the supporting section to support the mounting component and the solder section for self-alignment, it is possible to align the board electrode and the mounting electrode by self-alignment effected by melting of solder composing the solder section while supporting the mounting component with the supporting section. Thus, it is possible to manufacture a solder mounting structure with board electrode and mounting electrode being aligned with high precision.

In the method of the present invention for manufacturing solder mounting structure, a spherical member may be used as the supporting section.

According to the method, since the supporting section is a spherical member, the spherical member rotates accordingly to the relatively horizontal movement of the board and the mounting board effected by melted solder. As such, the self-alignment smoothly progresses.

The method for manufacturing solder mounting structure of the present invention is preferably arranged such that the board electrode and mounting electrode have a recess section.

According to the method, since said board electrode and mounting electrode have a recess section, when self-alignment is performed, the rotation of the spherical member stops at the position where the recess section of each board electrode and mounting electrode face each other. That is to say, the position where the spherical member is sandwiched between the recess sections of each electrode will be the self-alignment position. Thus, when performing self-alignment, the supporting section can be securely fixed at the recess sections of each electrode. Therefore, it is possible to perform the alignment of the board electrode and the mounting electrode with even higher precision.

With the method for manufacturing solder mounting structure of the present invention, a solder paste may be used as the solder. Thus, the solder may be applied easily.

The electronic device of the present invention comprises any one of the aforementioned solder mounting structures.

According to the structure, it is possible to provide electronic device comprising solder mounting structures with alignment of high precision by self-alignment. For example, it is possible to provide such as mobile phones/digital still cameras.

The method for solder mounting of the present invention, in order to achieve the object, is a solder mounting method by which a board electrode of a board and a mounting electrode of a mounting component mounted on the board are joined with each other by a solder joint section, the method including forming the solder joint section comprising a solder section for solder-joining and a supporting section for supporting the mounting component, and aligning the board electrode and mounting electrode by self-alignment effected by solder composing the solder section while supporting the mounting component with the supporting section.

According to the structure, similarly with the method for manufacturing solder mounting structure, even if the mounting component is heavy, alignment by self-alignment is possible. Thus, it is possible to align board electrode and mounting electrode with high precision.

EFFECT OF INVENTION

The present invention, as above, includes a solder joint section comprising a solder section for solder-joining and a supporting section for supporting the mounting component. Therefore, even if the mounting component is heavy, it is possible to align a board electrode and a mounting electrode by self-alignment. Thus, the present invention provides solder mounting structures and the like with board electrodes and mounting electrodes being aligned with high precision.

For a fuller understanding of the nature and advantages of the invention, reference should be made to the ensuing detailed description taken in conjunction with the accompanying drawings.

EXPLANATION OF REFERENCE NUMERALS

1 Printed board (board)
2 Board electrode (electrode with a recess section)
3 Camera module (mounting component, optical element)
4 Mounting electrode (electrode with a recess section)
5 Solder joint section
10 Camera module structure (solder mounting structure)
16 Solder section
17 Supporting section (spherical member)
20a, 20b Recess section

BEST MODE FOR CARRYING OUT THE INVENTION

One embodiment of the present invention is described below with reference to FIG. 1 through 14. The present invention is not limited to this.

Figure 1:
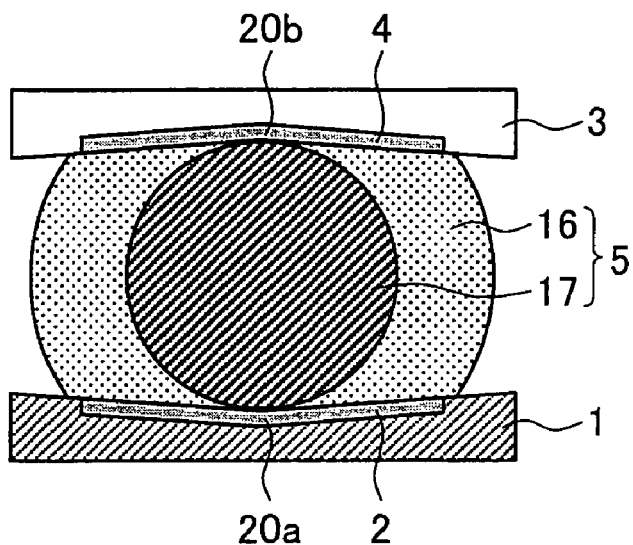
FIG. 1 is a cross sectional view illustrating a solder joint section of a solder mounting structure according to the present invention.
Figure 11:
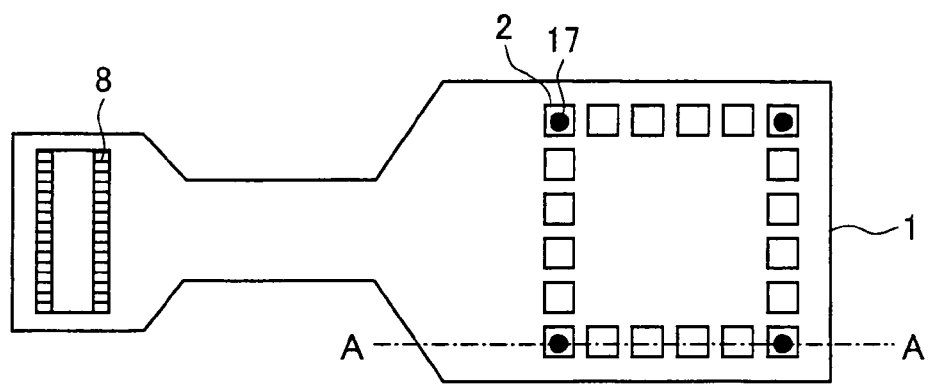
FIG. 11 is a plane view of another printed board of the solder mounting structure according to the present invention.
Figure 12:
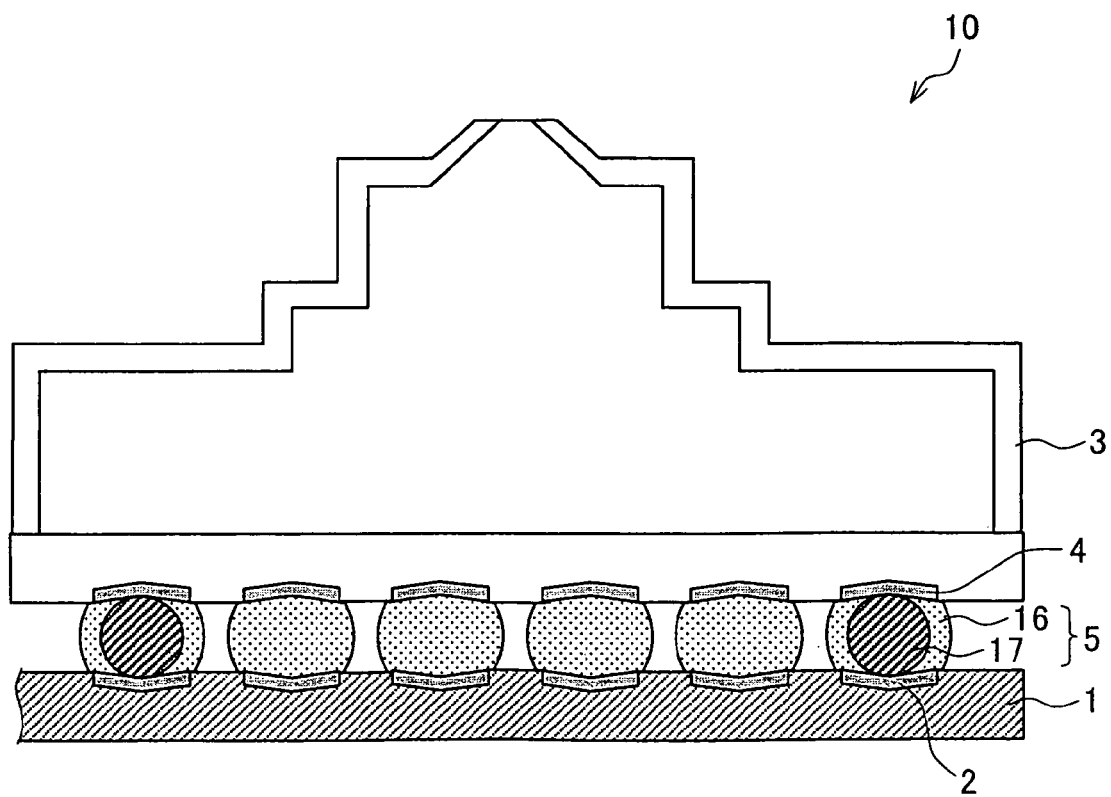
FIG. 12 is a partial sectional view of the solder mounting structure according to the present invention.

In the present embodiment, as a solder mounting structure, a camera module structure (solid-state imaging device) is described. This camera module structure is to be applicable to an electronics device such as mobile phones and digital still cameras. FIG. 12 is a partial sectional view of a camera module structure 10 of the present embodiment. FIG. 1 is a cross sectional view of a periphery of a solder joint section in the camera module structure 10. FIG. 11 is a plane view of a printed board 1 of the camera module structure 10 illustrated in FIG. 12.

The camera module structure 10 in the present embodiment includes the printed board (board) 1 and a camera module (mounting component; optical element) 3 mounted on printed board 1. The printed board 1 and the camera module 3 are joined with each other via a solder joint section 5. In other words, the camera module structure 10 has such a structure that the camera module 3 is placed on the printed board 1 with the solder joint section (solder pad) 5 therebetween.

The printed board 1, as illustrated in FIG. 11, is a board of a sheet form. On one of the surfaces of the printed board 1, a plurality of board electrodes 2 and connectors 8 are formed.

The board electrodes 2 are for solder-joining the camera module 3. That is to say, in an area with a plurality of board electrodes 2 formed therein, the camera module 3 (not illustrated in FIG. 11) is to be mounted.

The connector 8 is for connecting the camera module 10 with another component. For example, through the connector 8, the image data taken by the camera module 3 is transmitted to another member. As such, the printed board 1 also functions as a relay board.

The camera module 3 is a lens member, which is to be installed in such as mobile phones and digital still cameras. On an undersurface of the camera module 3, a plurality of mounting electrodes 4 are formed corresponding to the board electrodes 2 on the printed board 1. The plural board electrodes 2 and mounting electrodes 4 are positioned to face each other, and are joined together by the solder joint section 5. That is to say, the board electrodes 2 and mounting electrodes 4 are joining terminals.

In the present embodiment, as described in FIG. 1, board electrode 2 and mounting electrode 4 respectively have recess sections 20a and 20b. A supporting section 17 (described later) is sandwiched between these recess sections 20a and 20b.

The board electrodes 2 and mounting electrodes 4 may be metal-plated (gold plate, copper plate, solder plate or the like).

Here, characteristic features of the camera module structure 10 in the present embodiment are described below.

A most remarkable feature of the camera module structure 10 is that the board electrodes 2 and mounting electrodes 4 are aligned by self-alignment, and the solder joint section 5 which joins the board electrodes 2 and mounting electrodes 4 with each other comprises a solder section 16 formed with solder for solder-joining and a supporting section 17 for supporting the camera module 3.

"Alignment of the board electrodes 2 and mounting electrodes 4" is, for example, the position to align the board electrodes 2 and mounting electrodes 4 to face each other, and to arrange the board electrodes 2 and mounting electrodes 4 to designated positions. The present embodiment performs this alignment by self-alignment effected by the solder section 16 and supporting section 17.

To attain self-alignment, it is necessary to lift a mounting component by surface tension and stress of molten solder. Therefore conventional self-alignment is only practiced with comparatively small and light-weight mounting components such as IC packages. The reason of this is, if the self-alignment is performed with heavy-weight mounting components, the molten solder cannot withstand the weight, and the surface tension does not function.

The inventor of the present invention firstly attempted to gain surface tension and stress by using a solder with high surface tension when melted. However, it was found that such solder has a poor wettability, which leads to defect in soldering and also to a lower joint reliability. Furthermore, the inventor of the present invention attempted to control the melting state of the solder by temperature adjustment, only to find out that an extremely advanced temperature adjustment is required to do so and therefore this arrangement is realistically unsuitable for bulk production.

As a result of diligent study, the inventors focused attention on the fact that the conventional solder joint section is composed of a single solder, and reached to an arrangement in which the solder joint section includes the solder section 16 and supporting section 17.

Specifically, in order to align the printed board 1 and camera module 3 (more specifically the board electrode 2 and mounting electrode 4) with high precision by self-alignment, the camera module structure 10 in the present embodiment is arranged such that the solder joint section 5 includes the solder section 16 for lifting the camera module 3 by surface tension, and the supporting section 17 for supporting the camera module 3.

More specifically, in the present embodiment, the solder joint section 5 comprises the supporting section 17 made of a material with a higher melting temperature than that of the solder composing solder section 16. Thus, when the solder is melted in order to form the solder section 16, the supporting section 17 will not melt, and will stay solid. Therefore, even a heavy-weight mounting member such as the camera module 3 can be securely supported with the supporting section 17. Accordingly, it becomes possible to perform the alignment by the self-alignment with the molten solder (solder of solder section 16) while supporting the camera module 3 with the solid supporting material 17.

In the solder joint section 5, the proportion of the areas of solder section 16 and supporting section 17 (the occupancy of the solder section 16 or supporting section 17 in the solder joint section 5) is not particularly limited, and may be set depending on the mounting components such as the camera module 3. For example, in the case the mounting component is light, an increase in the proportion of the solder section 16 makes it easy for the surface tension to function, thereby allowing smooth self-alignment. On the other hand, in the case where the mounting component is heavy such as the camera module 3, an increase in the proportion of the supporting section 17 makes it possible to support the mounting section securely.

In the above structure, the supporting section 17 is set in a central part of the solder joint section 5. This makes it possible to support the camera module 3 stably. In addition, since solder joint section 5 is formed covering the board electrode 2 and mounting electrode 4, the printed board 1 and camera module 3 are securely joined with each other. This provides the camera module structure 10 with a high joint reliability. The formation of the solder joint section 5 will be described later.

Figure 10:
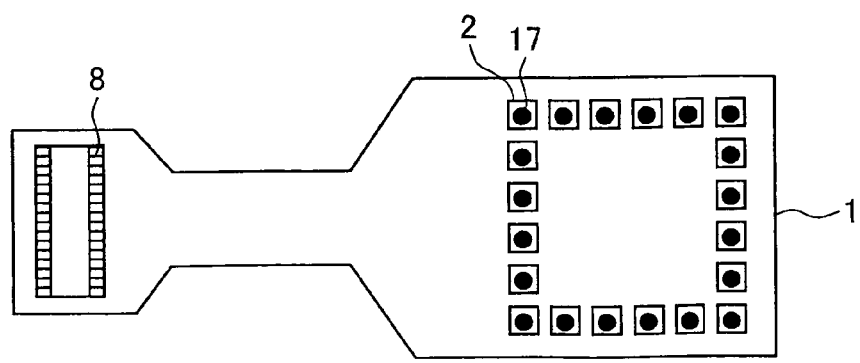
FIG. 10 is a plane view of a printed board of the solder mounting structure according to the present invention.

In the embodiment, as in FIG. 11, a plurality of the board electrodes 2 are positioned in a quadrilateral form. Only the board electrodes 2 positioned on the corners of the quadrangle are joined by the solder joint section 5 comprising the solder section 16 and supporting section 17, and board electrodes 2 positioned other than corners are joined by only the solder section 16. However, the solder joint section 5 comprising the solder section 16 and supporting section 17 may be formed for all the board electrodes 2, as illustrated in FIG. 10.

As such, it is required that the solder joint section 5 comprising solder section 16 and supporting section 17 be formed for at least part of board electrodes 2. In addition, the positions of the board electrodes 2 may be set according to the component to be mounted, and is not particularly limited.

Next, we will explain the method for manufacturing the camera module structure 10 in the embodiment. FIG. 2 through 8 are cross sectional views illustrating the manufacturing process of camera module structure 10.

The method for manufacturing the camera module structure 10 in the embodiment comprises forming the solder joint section 5 for joining the board electrode 2 formed on the printed board 1 and the mounting electrode 4 formed on the camera module 3 (solder joint section formation step).

The method of manufacturing the camera module structure 10 in the embodiment has the feature wherein within the solder joint section formation step includes forming the solder joint section 5 from the supporting section 17 and solder section 16, and the method also includes performing alignment of the board electrode 2 and mounting electrode 4 by self-alignment.

A detailed description of the method of manufacturing the camera module structure 10 is as follows.

Figure 2:
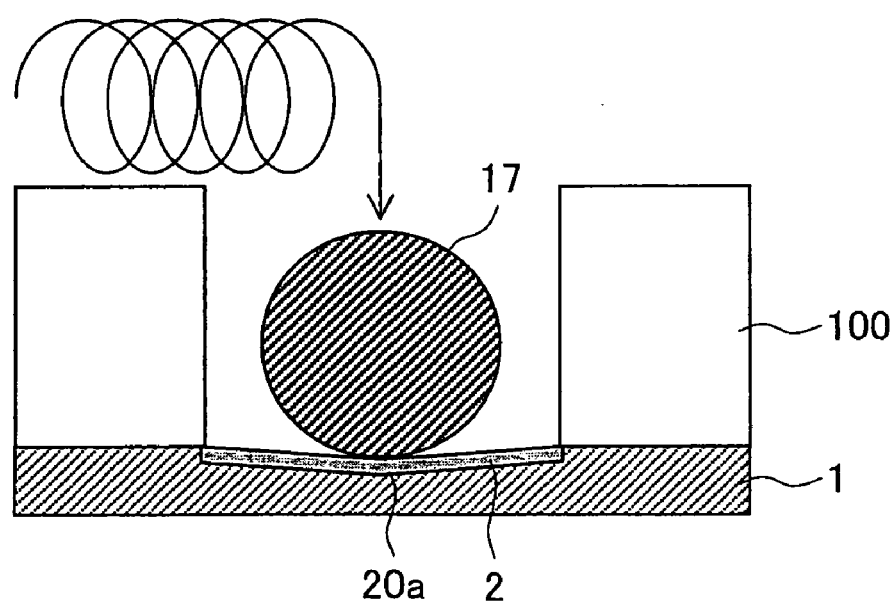
FIG. 2 is a cross sectional view illustrating a formation step of the solder joint section in FIG. 1.

Firstly, as described in FIG. 2, a solder mask 100 is positioned in order to supply the solder to the location of the board electrode 2 on the printed board 1. The solder mask 100 has an opening slightly larger than the location of the board electrode 2. Therefore, when positioning the solder mask 100 to the printed board 1, the location of the board electrode 2 on the printed board 1 is exposed through the opening. Secondly, a spherical member (for example, beads etc.) is positioned in the opening of the solder mask 100 (that is to say, the exposed portion of the board electrode 2) in order to form the supporting section 17 therein. For example, by scattering on the solder mask 100 the beads for forming the supporting section 17, the member that composes the supporting section 17 is easily supplied to the opening of the solder mask 100. That is to say, the beads forming the supporting section 17 is securely supplied to the board electrode 2.

Figure 3:
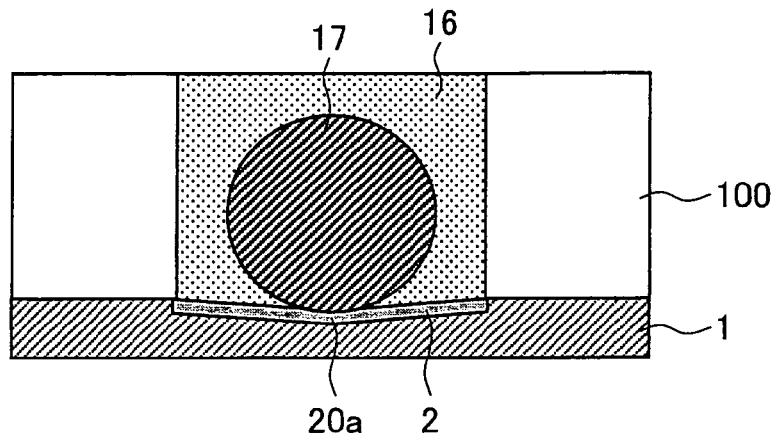
FIG. 3 is a cross sectional view illustrating the formation step of the solder joint section in FIG. 1.

Next, as described in FIG. 3, furthermore, the solder for the solder section 16 is applied (printed) from above the solder mask 100. In this embodiment, the solder for the solder section 16 is solder paste, and the solder of the solder section 16 is applied to the opening of the solder mask 100 by solder printing. In addition, when applying the solder for the solder section 16, the solder for forming the solder section 16 is so applied that it covers the beads composing the supporting section 17. Thus, as described in FIG. 3, the beads composing the supporting section 17 is embraced within the inside of the solder section 16.

Figure 4:
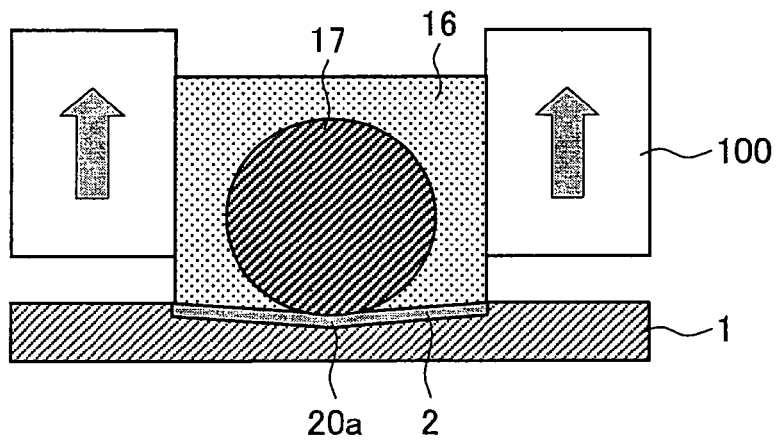
FIG. 4 is a cross sectional view illustrating the formation step of the solder joint section in FIG. 1.
Figure 5:
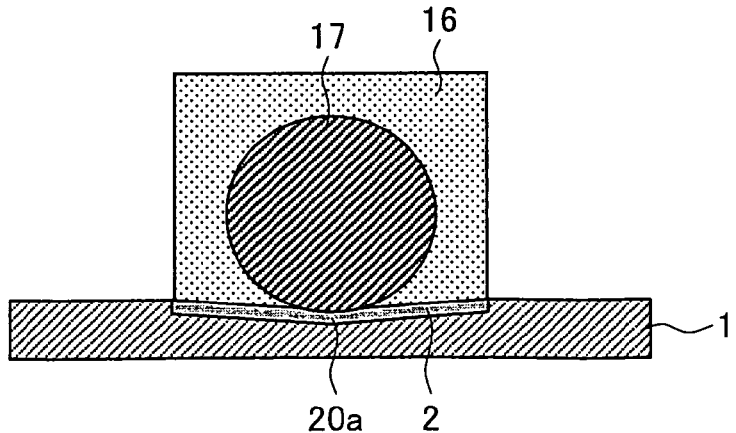
FIG. 5 is a cross sectional view illustrating the formation step of the solder joint section in FIG. 1.

Next, as described in FIG. 4, after the completion of applying the solder for forming the solder section 16, the solder mask 100 is removed from the printed board 1. Thereby, as described in FIG. 5, the solder joint section 5 (solder pad) comprising the solder section 16 and supporting section 17 is formed on the board electrode 2 on the printed board 1. Because the opening of the solder mask 100 is slightly larger than the board electrode 2, the board electrode 2 is covered with the solder section 16 and supporting section 17.

In this embodiment, the melting temperature of the solder composing the solder section 16 is lower than the melting temperature (melting point) of the beads composing the supporting section 17.

Figure 6:
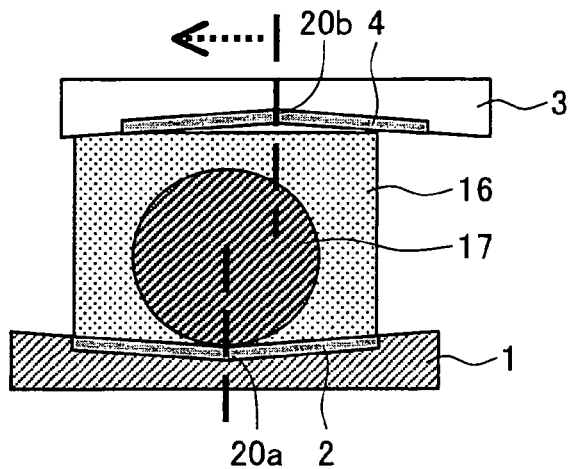
FIG. 6 is a cross sectional view illustrating the formation step of the solder joint section in FIG. 1.

Next, as described in FIG. 6, the camera module 3 is placed onto the solder joint section 5 by an installation machine (transport device). At this time, the camera module 3 is so positioned that the mounting electrodes 4 of the camera module 3 are facing the board electrodes 2 on the printed board 1.

Here, an alignment in high precision is necessary for the camera module 3. However, the positioning of the camera module 3 by the installation machine cannot attain the adequate alignment of the board electrode 2 and mounting electrode 4. For example, if the board electrode 2 and mounting electrode 4 should be positioned (self-aligned) so that the board electrode 2 and mounting electrode 4 are opposite each other and the edge of each electrode is respectively aligned (a recess section 20a and a recess section 20b face each other), then the alignment of the board electrode 2 and mounting electrode 4 illustrated in FIG. 6 is inadequate, as indicated by the broken line in FIG. 6. Therefore, for example, as indicated by the broken arrow in FIG. 6, it is required to align the board electrode 2 and mounting electrode 4 by moving the camera module 3 to the left side.

In the present embodiment, these inadequate alignments will be corrected by self-alignment effected by the molten solder.

As previously said, the melting temperature of the solder composing the solder section 16 is lower than the melting temperature of the beads composing the supporting section 17. Therefore, in order to perform the self-alignment, firstly heat is applied to a temperature higher than the melting temperature of the solder composing the solder section 16, though lower than the melting temperature of the beads composing the supporting section 17. Thus, as described in FIG. 7, the solder composing the solder section 16 melts whereas the beads composing the supporting section 17 do not melt. Therefore, even if the solder composing the solder section 16 melts, the camera module 3 is supported by the supporting section 17 that has not melted. As such, the load of the camera module 3 is supported not to crush down the solder section 16 and supporting section 17 (arrow in figure).

This heat application may be performed by, for example, a reflow device. In addition, the camera module 3 is supported not just by the supporting section 17 but also the surface tension of the molten solder composing the solder section 16.

Figure 7:
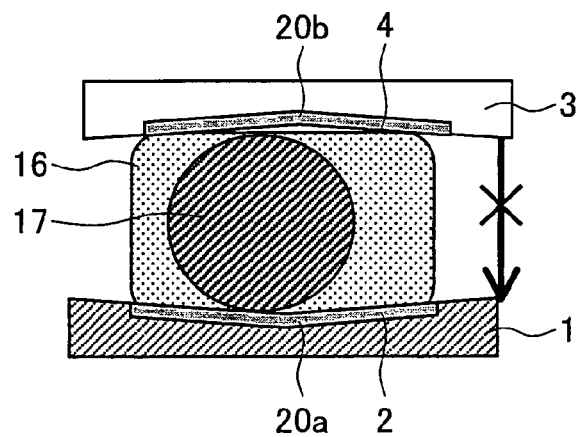
FIG. 7 is a cross sectional view illustrating the formation step of the solder joint section in FIG. 1.

In addition, the heat application spreads the solder composing the solder section 16 horizontally, and as noticed by comparing FIG. 6 and FIG. 7, thins the thickness of the solder section 16 (lowers the height of the solder section 16). That is to say, due to the heat application, the board electrode 2 and mounting electrode 4 get closer to each other. Consequently, the surface tension functions between the solder composing the solder section 16 and mounting electrode 4. Meanwhile the beads (solid) composing the supporting section 17 supports the camera module.

Figure 8:
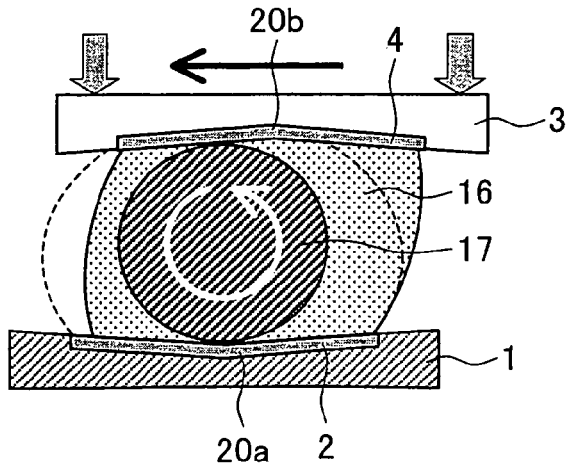
FIG. 8 is a cross sectional view illustrating the formation step of the solder joint section in FIG. 1.

When the solder composing the solder section 16 is melted in the state in which the camera module 3 is supported by the supporting section 17, horizontal movement of the solder composing the solder section 16 (arrow in figure) becomes possible due to elasticity stress, as described in FIG. 8. This movement causes the alignment of the board electrode 2 and mounting electrode 4 (broken line in figure). Thus, the self-alignment is performed by the solder section 16 for effecting the elasticity stress to cause the alignment, and by the supporting section 17 for supporting the camera module 3. In the present embodiment, since the beads in a sphere form is used as the supporting section 17, the beads composing the supporting section 17 also rotate accordingly to the relatively horizontal movement of the printed board 1 and camera module 3 in response to the solder composing the solder section 16. Therefore, self-alignment progresses smoothly.

Furthermore, the board electrode 2 and mounting electrode 4 are provided with the recess section 20a and 20b, respectively. Therefore, at the time of the self-alignment, the beads composing the supporting section 17 stay between in a position where the recess section 20a and recess section 20b is, and do not go any further. Therefore, it is possible to perform the alignment of the board electrode 2 and mounting electrode 4 even more accurately.

Lastly, by cooling the molten solder section 16, the formation of the solder joint section 5 is completed.

As such, the present embodiment can make it possible to obtain the effect of the self-alignment effected by the surface tension of the molten solder of the solder section 16 while supporting the camera module 3 with the supporting section 17. Therefore, even if in case where comparatively heavy-weight members such as the camera module 3 are mounted to the printed board 1, the problem that self-alignment effect may not be achieved due to the load of the camera module 3 is solved.

On the other hand, since the solder joint section 5 is conventionally composed of a single (one type) solder, the camera module 3 is supported only by the surface tension of the molten solder. That is, the camera module 3 is supported only by the surface tension of the solder composing the solder section 16. However, heavy-weight mounting components such as the camera module 3 cannot be supported just by the surface tension, whereby self-alignment cannot be attained. In addition, if a solder with a high surface tension at the time of melting is used as the single solder in order to obtain the surface tension and stress of the molten solder, the high surface tension causes defective soldering (nonwetting) and poor reliability.

In the present embodiment, the solder section 16 may be composed of one type of solder, or may be composed of plural types of solder with different characteristics. For example, these plural types of solder may have different melting temperatures and/or surface tensions.

In addition, the present invention is not particularly limited to the present embodiment, in which after supplying to the opening of the solder mask 100 the beads forming the supporting section 17, the solder for forming the solder section 16 is supplied. The solder for forming the solder section 16 and the beads for forming the supporting section 17 may be supplied in any order. They may be supplied at the same time, or the solder forming the solder section 16 may be supplied before the beads for forming the supporting section 17 is supplied.

In addition, in the embodiment, the supporting section 17 is constituted by a spherical bead, however the material composing the supporting section 17 is not particularly limited. The supporting section 17 may be constituted by, for example, glass, ceramic metal, or the like. In addition, from the point of quality in soldering, the supporting material 17 is preferably plated with a material of good affinity with the solder and good electrical conductivity. For example, the supporting material 17 is preferably plated with any one selected from the group consisting of Au, Ag, Cu, Sn, and alloys thereof.

In addition, in the present embodiment, as illustrated in FIG. 11, the supporting section 17 is provided for part of the board electrodes 2, however the supporting section 17 is may be provided in any board electrodes 2, and supporting section 17 may be positioned for all board electrodes 2 as illustrated in FIG. 10.

Figure 13:
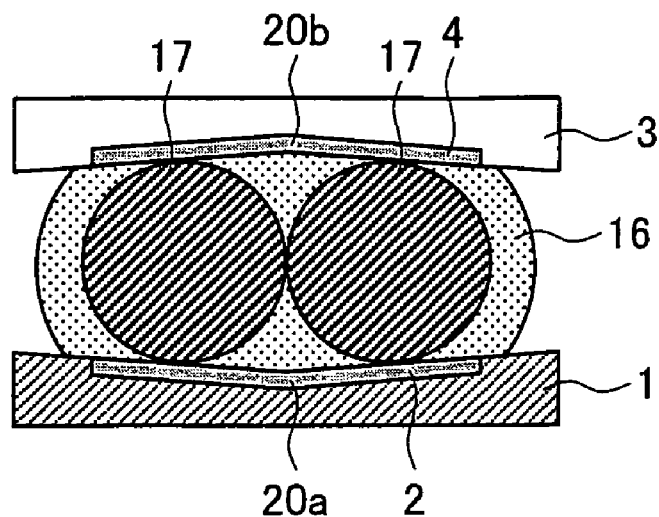
FIG. 13 is a partial sectional view of a solder joint section of another solder mounting structure according to the present invention.

In addition, in the present embodiment, the beads comprising the supporting section 17 supplied to the opening of the solder mask 100 are supplied one each per one board electrode 2. However, a plurality of supporting sections 17 may be provided per board electrode 2 by supplying a plurality of beads per board electrode 2. FIG. 13 is a cross sectional view illustrating an example with two supporting sections 17 formed in the solder joint section 5. As illustrated in FIG. 13, the solder joint section 5 may have a plurality of portions in which a supporting section 17 is formed.

In the structure of FIG. 13, a recess section 20a and a recess section 20b have a function of preventing the supporting sections 17 from escaping from where they are supposed to be. In addition, the supporting sections 17 supports the camera module 3, and due to the stress caused by the viscosity of the melted solder, self-alignment becomes possible.

As in FIG. 13, even if the supporting sections 17 are not positioned symmetrically, the self-alignment is still possible. This is because the camera module structure is provided with a plurality of structures as illustrated in FIG. 13, which pull the camera module 3 respectively where they are, thereby positioning the camera module 3 in the appropriate position.

In the present embodiment, the melting temperature and the melting time of the solder composing the solder section 16 may be set considering heat resistances of the components to be installed on the printed board 1 (camera module 3). That is to say, the melting temperature and the melting time of the solder composing the solder section 16 are not particularly limited, provided that the melting temperature and the melting time of the solder composing the solder section 16 will not damage the printed board 1 and camera module 3.

Figure 9:
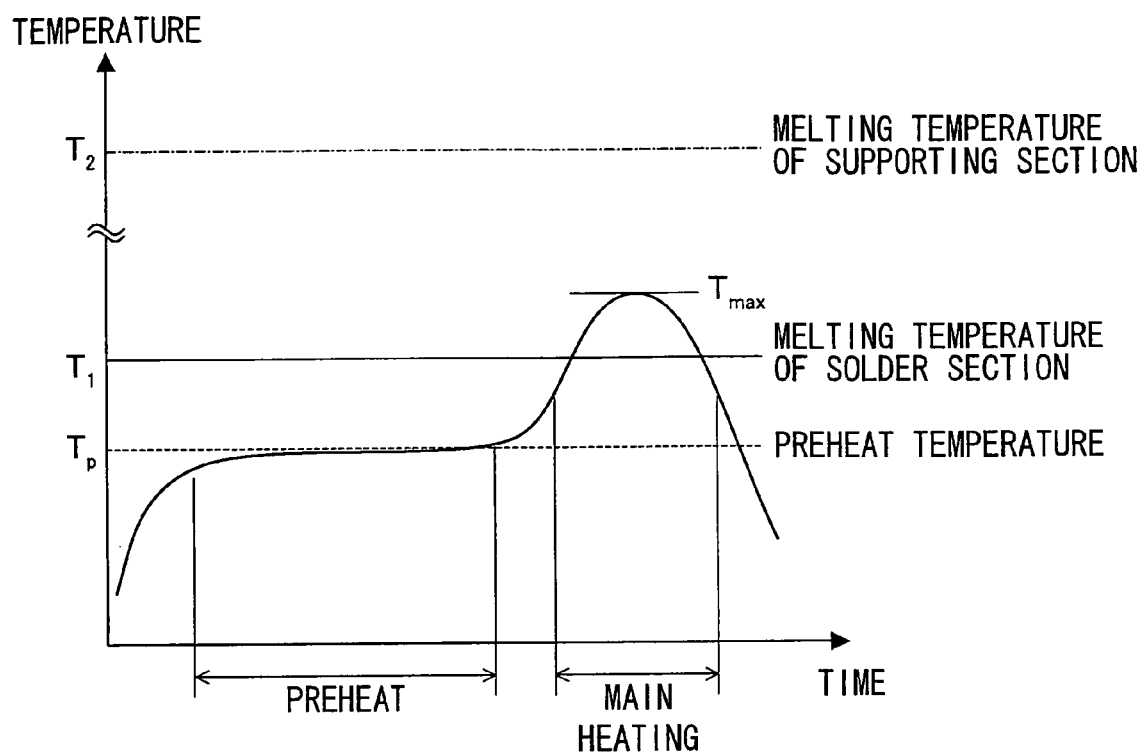
FIG. 9 is a graph illustrating a thermal profile of solder used in the solder joint section in FIG. 1.

For example, FIG. 9 is an actual thermal profile for melting the solder in soldering the camera module 3 on to the printed board 1. As illustrated in FIG. 9, the solder is temporally kept at a preheat temperature (Tp) lower than the solder melting temperature of the solder composing the solder section 16, thereby evenly distributing the temperature over the printed board 1 (preheat). After this, the solder is heated a temperature equal to or higher than the melting temperature of the solder section 16 (T1), and is rapidly cooled in order to prevent the graining of the solder (main heating).

In FIG. 9, the melting temperature of the solder composing the solder section 16 (T1) should be equal to or lower than Tmax, which is a mounting peak temperature restricted by the heat resistance of the camera module 3. However the melting temperature of the supporting section 17 (T2) may be equal to or higher than Tmax. In addition, the temperature is usually elevated gradually from room temperature, and is then kept temporally at a temperature under the melting temperature of the solder composing the solder section 16 (T1), thereby performing the preheat. After this, the temperature is elevated to the temperature equal to or higher than the melting temperature of the solder composing the solder section 16, and is then cooled rapidly.

For example, the melting temperature of the solder composing the solder section 16 is preferably in a range of 140° C. to 219° C., and more preferably in a range of 183° C. to 190° C. The supporting section 17 is not particularly limited as long as it has a higher melting temperature than the solder composing the solder section 16. In addition, the difference in the melting temperature between the solder composing the solder section 16 and supporting section 17 is not particularly limited. However, a greater difference in the temperature makes it possible to more securely melt the solder section 16 only.

In addition, the solder composing the solder section 16 preferably has a high affinity with the material of the supporting section 17. For example, in the case the supporting section 17 is made of Au, Ag, Sn, or any material being plated with any of them, the solder composing the solder section 16 is preferably made of either Sn, Ag, Bi or In. This makes it possible to form the solder joint section 5 without separating the solder section 16 and supporting section 17.

In addition, the type of solder used in the present embodiment is not particularly limited, however it is environmentally preferable to use so-called Pb-free solder. The Pb-free solder may be, but not limited to, Sn—Ag type solder, Sn—Zn type solder, Sn—Bi type solder, Sn—In type solder, or Sn—Ag—Cu type solders. In addition, the compositional proportion of the solder constituents is also not particularly limited.

In addition, the solder the composing the solder section 16 may have flux therein. In other words, the solder composing the solder section 16 may be solder paste (cream solder) containing a flux agent or the like. This provides the solder with greater wettability and flowability. This gives a greater self-alignment effect.

The type of flux is not particularly limited, and may be set according to the constituents of the electrodes formed on the mounting component and board respectively. For example, the flux may be corrosive flux ($ZnCl_2$—$NH_4Cl$ type mixed salt etc.), slow flux (organic acid and its derivatives etc.), non-corrosive flux (a mixture of rosin and isopropyl alcohol), aqueous flux (rosin-type flux etc.), low-residue flux (rosin-type or resin-type flux with solid constituent of 5% or less and the activating agent as organic acid) or the like.

Figure 14:
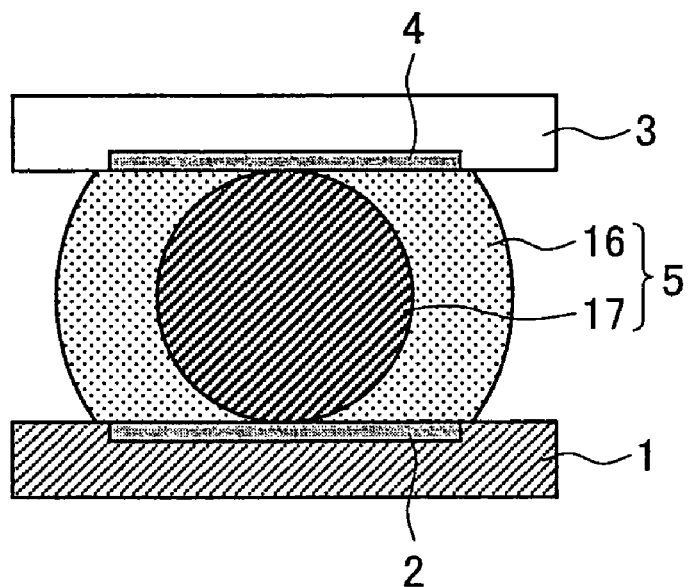
FIG. 14 is a sectional view of a solder joint section of still another solder mounting structure according to the present invention.

The solder joint section 5 in the present embodiment may have the following structure. FIGS. 13 and 14 are cross sectional views illustrating a different structure of a solder joint section 5.

In the structure in FIG. 1, one supporting section 17 is provided per solder joint section 5, whereas in the structure in FIG. 13, plural supporting sections 17 (two in FIG. 13) is provided per solder joint section 5. With this structure, it is possible to stably support the camera module 3.

In addition, in the structure in FIG. 1, the board electrode 2 and mounting electrode 4 respectively comprise the recess section 20a and 20b, which are respectively recessed inwards of the printed board 1 and camera module 3. In addition, the supporting section 17 is constituted by a spherical bead, whereas in the structure of FIG. 14, the board electrode 2 and the mounting electrode 4 are flat.

The method for manufacturing the camera module structure 10 in the embodiment is applicable as a method of solder mounting. With this method, it is possible to solder the board and the mounting component in high precision by self-alignment.

The invention being thus described, it will be obvious that modifications are possible within the scope of the claims. In other words, any embodiments with modifications in art incorporated within the scope of the claims are to be included within the scope of the art of the invention.

INDUSTRIAL APPLICABILITY

The present invention, in which a solder joint section is formed from a plurality of solders, realizes alignment by self-alignment while supporting the electronic component being mounted on the board. Accordingly, the present invention is applicable to any solder mounting structure, and is applicable to the electronics component industry. Especially, the present invention is preferably applicable to soldering of joining boards (printed board) to which heavy-weight electronic components such as camera modules (for such as digital still cameras and mobile phones) comprising a shooting lens and a solid-state image sensor integrally.

The invention claimed is:

1. A solder mounting structure wherein:
    a board electrode of a board and a mounting electrode of a mounting component mounted on the board are joined with each other by a solder joint section;
    said solder joint section comprises a solder section for solder-joining and a supporting section for supporting the mounting component;
    said board electrode and said mounting electrode being aligned by self-alignment effected by the solder section and the supporting section,
    the supporting section being made of a material with a higher melting temperature than solder composing the solder section,
    the solder section covering all of the supporting section except for a part of the supporting section in contact with said board electrode and a part of the supporting section in contact with said mounting electrode, and
    the supporting section is sandwiched between a recess section of said board electrode and a recess section of said mounting electrode.

2. A solder mounting structure as set forth in claim 1, wherein said supporting section is made of a material with a higher melting temperature than solder composing the solder section.

3. A solder mounting structure as set forth in claim 1, wherein said supporting section is made of an electrically conductive material.

4. A solder mounting structure as set forth in claim 1, wherein:
    said supporting section is spherical; and said supporting section is sandwiched between a recess section of said board electrode and a recess section of said mounting electrode.

5. A solder mounting structure as set forth in claim 1, wherein said board electrode and mounting electrode are covered with said solder joint section.

6. A solder mounting structure as set forth in claim 1, wherein said supporting section is provided in a central part of said solder joint section.

7. A solder mounting structure as set forth in claim 1, wherein said solder section is made of a Pb-free solder.

8. A solder mounting structure as set forth in claim 1, wherein said mounting component is an optical element.

9. A solder mounting structure as set forth in claim 8, wherein said optical element is a camera module.

10. A solder mounting structure as set forth in claim 1, wherein in said solder joint section, an area of the solder section is broader than an area of the supporting section.

11. A solder mounting structure as set forth in claim 1, wherein in said solder joint section, an area of the supporting section is broader than an area of the solder section.

12. A solder mounting structure as set forth in claim 1, wherein said supporting section, or at least a surface thereof, is made of a material selected from the group consisting of Au, Ag, Cu, Sn, and alloys thereof.

13. An electronic device comprising a solder mounting structure wherein:
    a board electrode of a board and a mounting electrode of a mounting component mounted on the board are joined with each other by a solder joint section;
    said solder joint section comprises a solder section for solder-joining and a supporting section for supporting the mounting component,
    said board electrode and said mounting electrode being aligned by self-alignment effected by the solder section and the supporting section,
    the supporting section being made of a material with a higher melting temperature than solder composing the solder section,
    the solder section covering all of the supporting section except for a part of the supporting section in contact with said board electrode and a part of the supporting section in contact with said mounting electrode, and
    the supporting section is sandwiched between a recess section of said board electrode and a recess section of said mounting electrode.

* * * * *